United States Patent [19]

Delacourt et al.

[11] Patent Number: 5,249,075
[45] Date of Patent: Sep. 28, 1993

[54] QUANTUM WELL WAVE MODULATOR AND OPTICAL DETECTOR

[75] Inventors: Dominique Delacourt, Paris; Michel Papuchon, Villebon; Emmanuel Dupont, Chatenay Malabry; Nakita Vojdani, Orsay, all of France

[73] Assignee: Thomson-CSF, Puteaux, France

[21] Appl. No.: 873,193

[22] Filed: Apr. 24, 1992

[30] Foreign Application Priority Data

Apr. 25, 1991 [FR] France .................. 91 05107

[51] Int. Cl.⁵ .................. H01L 31/0352; G02F 1/015
[52] U.S. Cl. .................................................. 359/248
[58] Field of Search ............ 359/276, 248, 245, 237; 257/14, 16

[56] References Cited

U.S. PATENT DOCUMENTS

| | | | |
|---|---|---|---|
| 4,826,295 | 5/1989 | Burt | 359/276 |
| 4,847,573 | 7/1989 | Fukuzawa et al. | 359/278 |
| 4,943,144 | 7/1990 | Delacourt et al. | 359/241 |
| 5,017,974 | 5/1991 | Greene | 359/245 |
| 5,047,822 | 9/1991 | Little, Jr. et al. | 359/245 |
| 5,068,867 | 11/1991 | Hasenberg et al. | 372/45 |

FOREIGN PATENT DOCUMENTS 2-637092 3/1990 France .

OTHER PUBLICATIONS

Applied Physics Letters, vol. 54, No. 25, Jun. 19, 1989, New York, USA, pp. 2589-2591, J. Khurgin, "Electro-Optical Switching and Bistability in Coupled Quantum Wells".

Superlattices and Microstructures, vol. 4, No. 6, 1988, London, GB, pp. 737-739, M. Paton, et al., "A Novel Asymmetrically Coupled Quantum Well Infrared Modulator".

Physical Review B: Condensed Matter, vol. 40, No. 15, Aug. 15, 1989, New York, USA, pp. 3028-3031, D. Y. Oberli et al., "Direct Measurement of Resonant and Nonresonant Tunneling Times in ...".

IEEE Journal of Quantum Electronics, vol. 25, No. 7, Jul. 1989, New York, USA, pp. 1671-1676, P. F. Yuh, et al., "Large Stark Effects for Transitions From Local States To Global States In Quantum Well ...".

Primary Examiner—Ian J. Lobo
Attorney, Agent, or Firm—Oblon, Spivak, McClelland, Maier & Neustadt

[57] ABSTRACT

A quantum well wave modulator comprises a central well sandwiched by two lateral wells. The central well is populated with electrons and the two lateral wells, having different constitutions, are coupled to the central well so as to modulate two light waves under the effect of the application of an electrical field perpendicularly to the structure in one direction or in the opposite direction.

13 Claims, 5 Drawing Sheets

POLARIZATION 1 (Pol₁)

POLARIZATION 2 (Pol₂)

QUANTUM WELL WAVE MODULATOR AND OPTICAL DETECTOR

BACKGROUND OF THE INVENTION

1. Field of the Invention

The invention relates to a quantum well electromagnetic wave modulator and a quantum well optical detector, more particularly applicable to the modulation or detection of several light waves.

The technical field of the invention is that of amplitude and phase modulators designed on the basis of quantum effects in semiconductors. To obtain this modulation, action is generally taken on the real and imaginary indices of a material crossed by the wave to be modulated. This action may be obtained, for example, through the application of an electrical field responsible for an electro-optical effect. In this domain of modulation, quantum semiconductor structures offer numerous possibilities, especially in the spectral ranges associated with the electron transitions that may occur either between quantum levels of different bands (namely between valence band and conduction band) or between quantum levels of the same band. In the latter case the transitions, which are then called intraband transitions, are liable to prompt very pronounced dispersal zones owing to the resonances that they bring into play. An external action that enables modification of the conditions in which these transitions occur is then capable of modifying the real and imaginary parts of the refraction indices of the materials brought into play, in the spectral range associated with these transitions. It is thus that the application of an electrical field to a semiconducting quantum well modifies the potential profile of this well and leads to a variation of the energy difference between the permitted levels that this well contains and provides a possibility of modulation. This is the Stark effect as described in R. P. G. KARUNASIRS, Y. J. MII and K. L. WANG, "Tunable Infrared Modulator And Switch Using Stark Shift In Step Quantum Wells", *IEEE Electron Device Letters*, vol. II, No. 5, May 90.

2. Description of the Prior Art

If the intraband transitions that cause major modifications of the optical properties of materials are to effectively occur, then the quantum levels from which they may arise should be populated (for example by electrons in the conduction and). Thus, action on this population also enables the modification of optical properties of materials. Two main options may be envisaged in order to do this. The first option consists in populating valence and conduction bands by an optical pumping operation in which the electrons are made to pass from the former to the latter. The second option uses electrical methods such as the injection of carriers.

SUMMARY OF THE INVENTION

It is the latter option that is used in the present invention in which it is sought to take advantage both of this possibility of injection and of the direct influence of the parameters of the quantum wells on the spectral localization of the abnormal dispersal related to the intraband transitions that occur within these wells.

A modulator such as this is known through the French patent application No. 2 637 092.

The invention is aimed at the making of optoelectronic devices (modulators, detectors) that work at several wavelengths.

The invention therefore relates to an electromagnetic wave modulator, of the type comprising:

a semiconductor structure comprising a first alternation of layers defining a first quantum well, as well as a second alternation of layers joined to the first alternation of layers and defining a second quantum well coupled to the first quantum well through a barrier layer;

means for populating the first quantum well with electrons, and means to control the absorption, by the second quantum well, of a wave to be modulated;

wherein said semiconductor structure comprises a third alternation of layers located on the other side of the second alternation of layers in relation to the first alternation and defining a third quantum well coupled to the first quantum well through another barrier layer, and wherein said control means include means capable of the application to the structure, upon command, of an electrical field perpendicular to the plane of the layers.

The invention also relates to an electromagnetic wave detector applying the modulator, wherein the means for the application of an electrical field enable the structure to be polarized in a determined direction to detect either one wavelength or another wavelength, and means for the detection of photocurrent created by the illumination at either of the two wavelengths.

The novel idea upon which the invention is based therefore consists in the injection, from a central well populated with carriers, of these carriers along the direction of polarization, in either one of two different satellite wells that are positioned on either side of this central well and within which there occur intraband transitions. Since the two satellite wells are different, a dispersal is created about a wavelength $\lambda_1$ or $\lambda_2$ depending on the sign of the polarization that has enabled the injection. It is also possible, in the same way and by means of the polarization, to reduce the dispersal at the wavelength $\lambda_c$ corresponding to transitions that occur within the populated well which is emptied to the benefit of either one of the two satellite wells.

BRIEF DESCRIPTION OF THE DRAWINGS

The different objects and features of the invention shall appear more clearly from the following description and from the appended drawings, of which.

MORE DETAILED DESCRIPTION

The appended figures are designed to be incorporated into the present description and may serve not only to provide a clearer understanding of the invention but also contribute to the definition of the invention, if necessary as a complement to the present invention.

Figure 1:
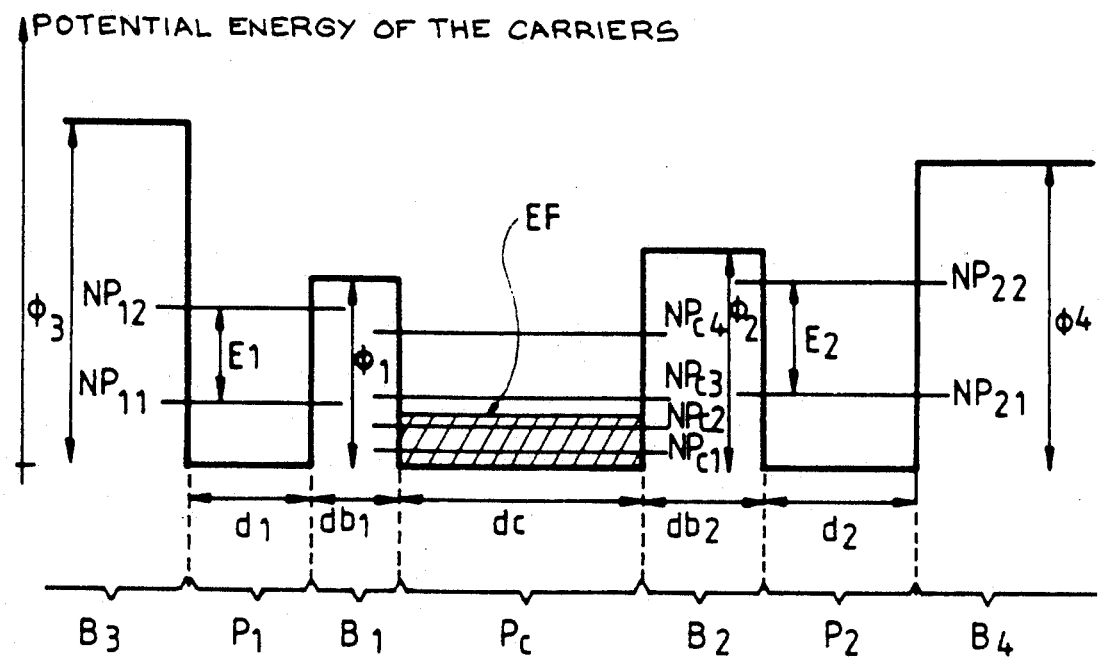
FIG. 1 shows an energy band diagram of a device according to the invention.
Figure 2:
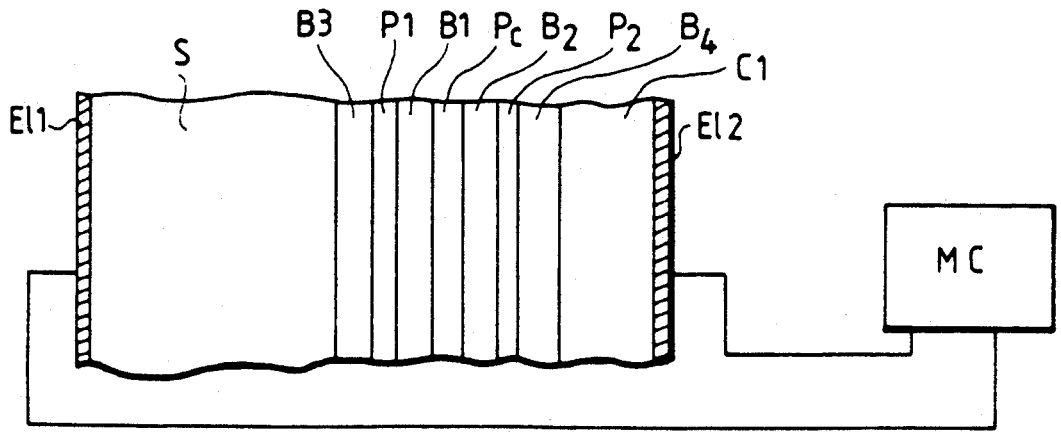
FIG. 2 shows an exemplary embodiment of the device of the invention.

FIG. 1 describes an exemplary quantum configuration that illustrates the invention and is made with a stack of layers as shown in FIG. 2. The device of FIG. 2 comprises the following on a substrate S:

a central layer $P_c$ sandwiched by two barrier layers B1 and B2 and constituting a first quantum well;

on either side of the barrier layers B1 and B2, there are two other layers of quantum wells P1 and P2 sandwiched by barrier layers B3 and B4 and defining respectively a second and a third quantum well.

The making of these different layers meets the criteria that shall be described with reference to FIG. 1.

Figure 3:
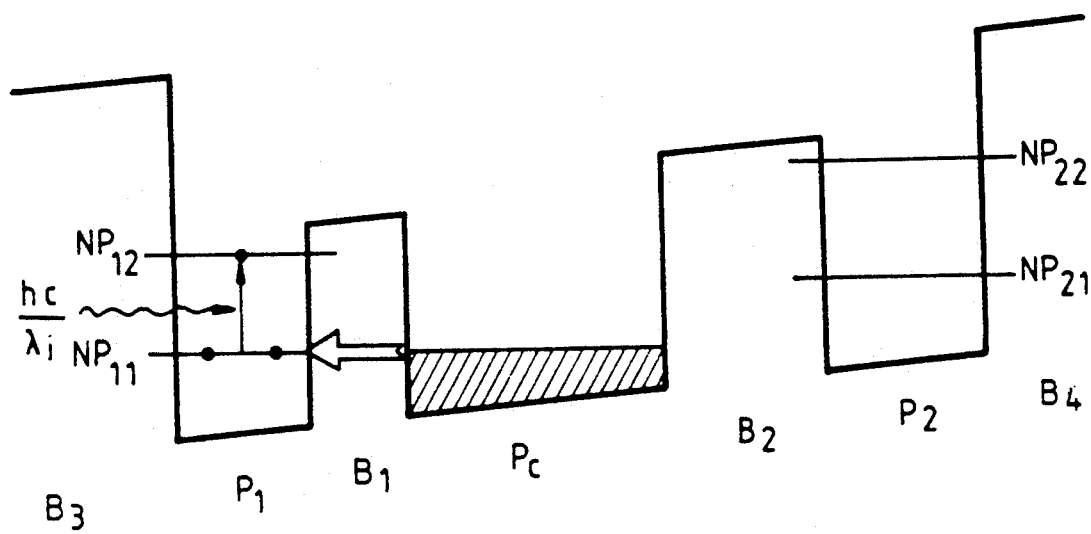
FIGS. 3 and 4 shows energy band diagrams illustrating the working of the device of the invention.

A doped central well $P_c$ constitutes a "reservoir of carriers". It should be noted that these carriers may be holes or electrons depending on whether the doping used is an N type or a P type doping. FIG. 1 therefore represents a potential energy profile. Two barriers B1 and B2 separate this central well from two satellite wells P1 and P2 respectively, also formed by the existence of barriers B3 and B4. The barriers B1 and B2 should have parameters which, when there is no external electrical polarization, bar the populating of the wells P1 and P2. These wells should be designed so as to have, for example, two levels (NP11 and NP12 in the well P1 and NP21 and NP22 in the well P2), the energies that separate these two levels being different in the two well (E1 for P1 and E2 for P2). These energies depend on the thicknesses $d_1$ and $d_2$ of the wells but also on the dimensions $db_1$ and $db_2$ and on the heights $\Phi_1$, $\Phi_2$, $\Phi_3$, $\Phi_4$ of the different potential barriers. FIG. 1 also shows an example of a level $E_F$ of filling of the central well and the levels $NP_{c1}$, $NP_{c2}$, $PN_{c3}$, $NP_{c4}$, ... which may exist within this central well $P_c$. A polarization (Pol1) as shown in FIG. 3 enables the well P1 to be populated by a transfer of the carriers from the central well $P_c$ towards this well P1, especially by means of the tunnel effect through the barrier B1.

This polarization is, for example, applied by a voltage generator MC connected to electrodes located on either side of the structure (FIG. 2).

Figure 4:
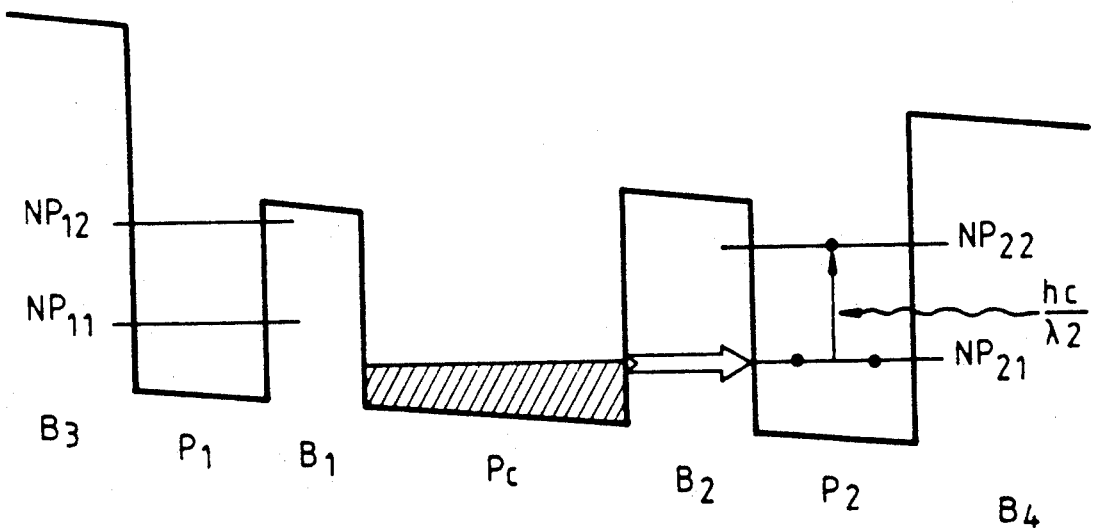

An opposite polarization (Pol2) such as the one shown in FIG. 4 enables the well P2 to be populated. These FIGS. 3 and 4 neither indicate the quantum levels of the second well nor specify the influence of these wells on the filling of the wells P1 and P2. In the former case (Pol1), an abnormal dispersal about the wavelength $\lambda_1$ ($\lambda_1 = hc/E1$) is seen to appear in the spectrum and, in the latter case (Pol2), this marked modification of the optical properties occurs about a wavelength $\lambda_2$ ($\lambda_2 = hc/E2$). with :

h: Planck's constant (h = 6.62 $10^{-34}$ J.s)

c: velocity of light in vacuum (c = $3.10^{10}$ m/s)

Hence, in acting on the population of the wells (P1 and P2), the occurrence of the transitions in these wells is activated, and consequently the absorption of energy photons close to $hc/\lambda_1$ in the well P1 (FIG. 3) or close to $hc/\lambda_2$ in the well P2 (FIG. 2) is activated.

The abnormal dispersal, which is illustrated also by a variation in refraction index, may therefore be modulated either about $\lambda_1$ if it is the polarization Pol1 that is modulated or about $\lambda_2$ if it is Pol2 that is modulated. It is also possible to consider a modulation such that it is possible to pass from Pol1 to Pol2 alternately, in periodically changing the sign obtained by electrical means (by means of MC for example). It is important to note that the resonant character of the dispersal is far more strongly marked in the non-doped wells populated by external action (for example by electrical means) than in doped wells. In particular, the width at mid-height of the resonant absorption is far smaller in the wells populated by external action than in doped wells. This is what has been observed in GaAs/GaAlAs wells where a factor of about 3 has been measured between the two widths. This corresponds to an absorption at the peak that is three times greater in the case of populating without doping, this being obtained for a same concentration of carriers brought into play. In this example, the carriers used were electrons and the doping was of the N type. Despite this, it may be worthwhile to use the intraband transitions liable to occur within the doped central well $P_c$. It is then possible to make a modulator with three wavelengths $\lambda_1$, $\lambda_2$ and $\lambda_c$, the latter value corresponding to an energy difference between two levels of this central well that are involved in intraband transitions. Thus, if we refer to the absorption, it goes from $\lambda_c$ to $\lambda_1$ when the external polarization goes from 0 to Pol1, and it goes from $\lambda_c$ to $\lambda_2$ when this polarization varies from 0 to Pol2, the modulation at $\lambda_c$ being obtained by the draining of the carriers from the central well.

Figure 5:
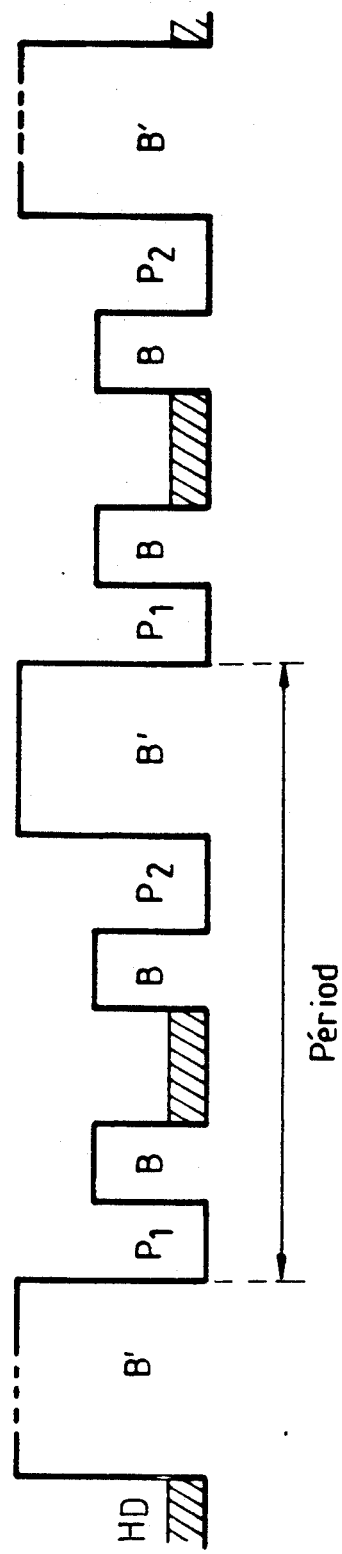
FIG. 5 shows an energy band diagram of a device according to the invention, comprising several stacks of layers similar to that of the device of FIG. 2.

It must be noted that, in the configuration with two wavelengths, the structure is completely transparent in the spectral range of operation when there is no polarization since the only wells active with respect to the intraband transitions are the two wells P1 and P2 which are non-populated without transition. To increase the efficiency of the phase and amplitude modulators based on the modulation of the polarization of the quantum structures, it is possible to associate several groups of wells such as are shown in FIG. 1. In this case, the barriers B3 and B4 will generally have the same height ($\Phi_4 = \Phi_3$). It is this configuration that is shown in FIG. 5 where, in addition and solely by way of an example, the barriers B equivalent to the barriers B1 and B2 have been chosen to be identical ($\Phi_1 = \Phi_2$ and $db_1 = db_2$). FIG. 5 also shows highly doped extreme regions (HDR) that favor the making of ohmic contacts which may be used for the polarization of the structure. The barriers B' (equivalent to B3 and B4) have been chosen to be higher than the barriers B in order to limit the circulation of carriers along the structure. This circulation is not necessary for the efficient operation of the device. On the contrary, it is responsible for an undesirable current. This configuration, where the barriers B' are higher than the barriers B, is however only a special case.

It must also be noted that transitions may arise between a level of one of the wells P1, P2 or $P_c$ and a level that does not belong only to these wells but is distributed throughout the structure P1/B1/$P_c$/B2/P2 or, again, in the continuum of states located above the conduction band edge the overall structure B3/P1/B1/$P_c$/B2/P2/B4. The possibilities of modulation, related to the control of the occurrence of these transitions by modification of the distribution of the carriers between the three wells, also forms part of the invention.

The populating of the central well $P_c$ is done:

either by the doping of the layers constituting this well, or by optical pumping that enables the creation of the carriers (electrons in the conduction band and holes in the valence band).

Figure 6:
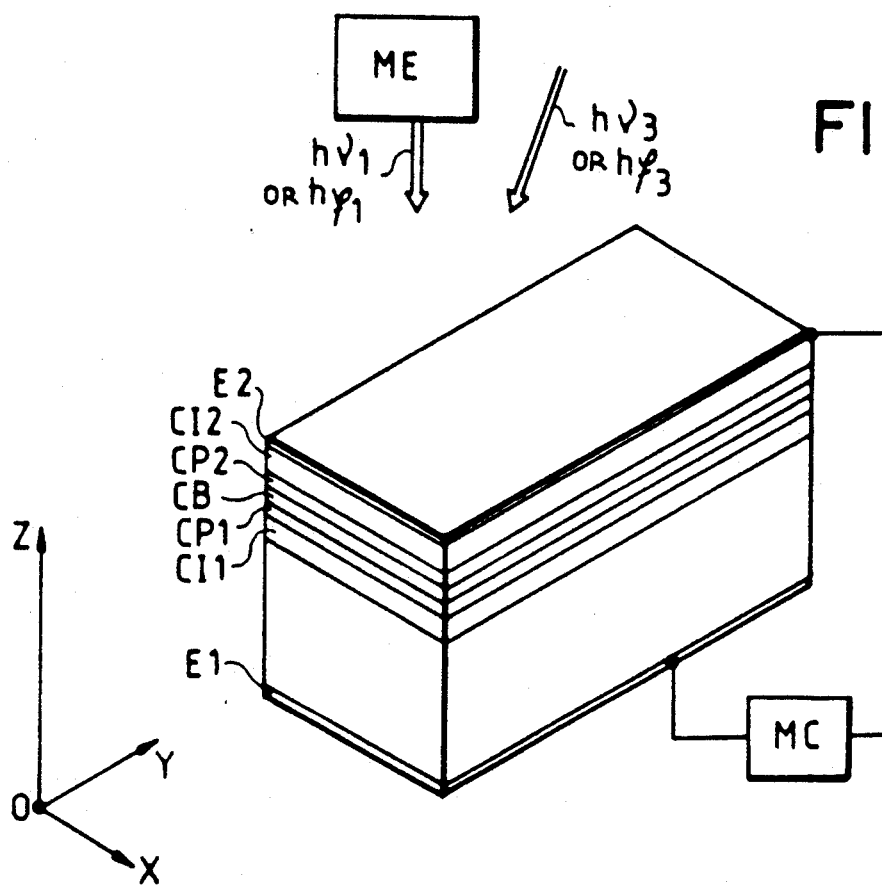
FIG. 6 shows an exemplary embodiment of the device of the invention working with a pumping beam.

This second approach is illustrated in FIG. 6 where $h\nu_1$ is the pump wave and $h\nu_3$ is the wave to be modulated.

It must be noted that the wave to be modulated may be transmitted to the structure in parallel to the plane of the layers.

The device of the invention thus enables amplitude and phase modulation with two or three wavelengths. This is achieved through the use of semiconducting quantum wells. This device enables the electrical injection, from a populated central well, of the carriers into either one of the two satellite wells placed on either side of this central well. The parameters of these two wells are such that the electron transitions or hole transitions liable to occur between quantum wells and modify the optical properties of the materials (the real and imaginary parts of the indices of refraction) do not act at the same wavelength. Thus a modulator is made, either at a first wavelength or at a second wavelength or again at both wavelengths, depending on the sign of the polarization used to modify the distribution of the carriers between the three wells. Two options are possible for the central well. The first one consists in making it play the role only of a reservoir of carriers without any modification, by the intraband transitions that occur within it, of the optical properties of the structure in the spectral range used. In this first option, the structure is completely transparent in this range when there is no polarization. In the second configuration it is sought, on the contrary, to cause the occurrence, within the doped well, of the transitions corresponding to the spectral range of operation so as to give a modulator with three wavelengths.

The structure of the invention can also be applied to the detection of electromagnetic radiation. A detector is then connected to the terminals of the structure and detects the flow of a current. A detector such as this enables the detection of three wavelengths according to the electrical polarization applied to the device.

The structure according to the invention may be made in different ways as regards notably the constitution, composition and thickness of the different layers.

Figure 7:
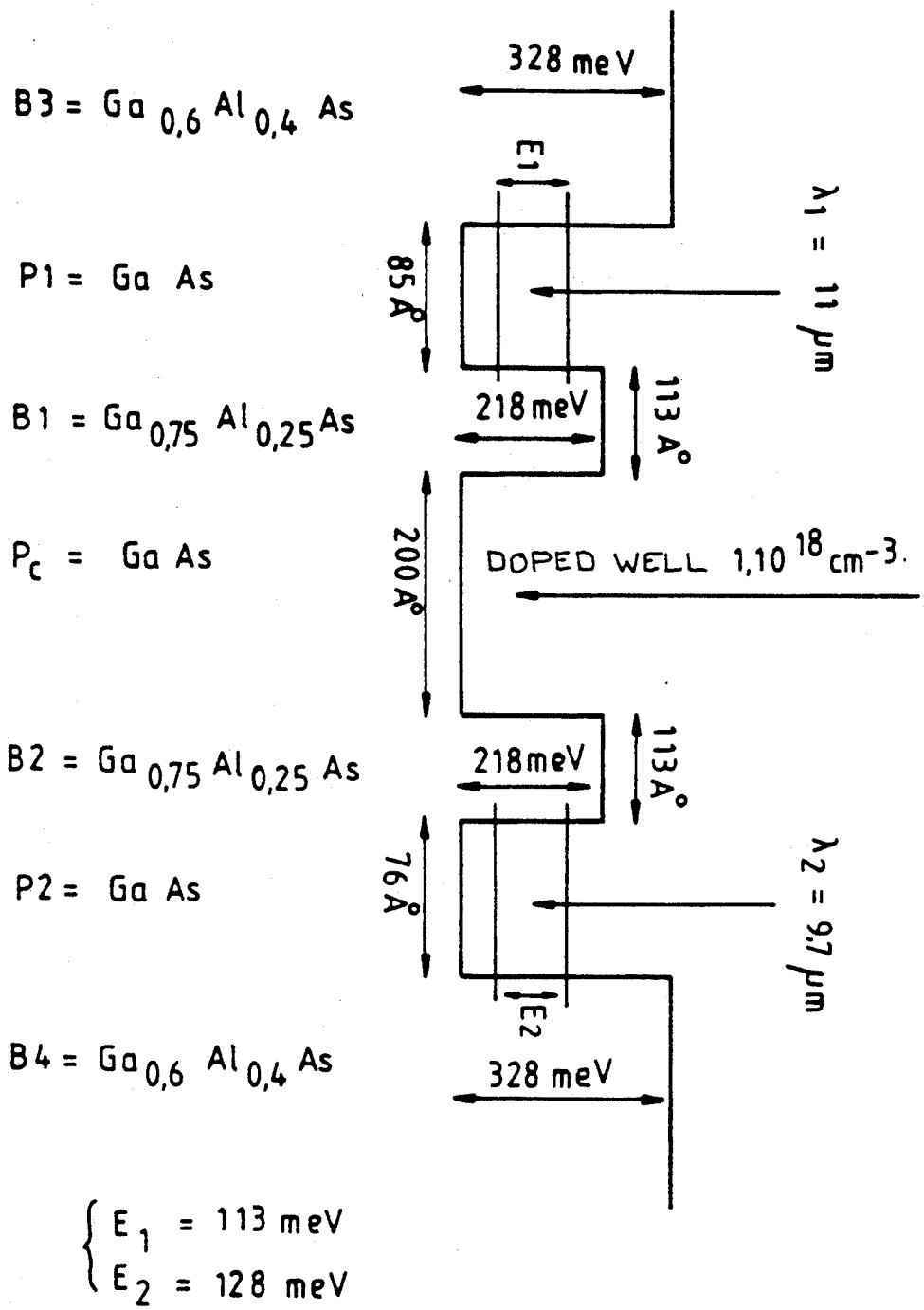
FIG. 7 shows a detailed exemplary embodiment of a device according to the invention.

However, by way of an example, it may be indicated that the structure of FIGS. 1 and 2 may be made as follows, as illustrated in FIG. 7:

barrier layer B3:
  material $Ga_{0.6}Al_{0.4}AS$
  $\Phi_3 = 328$ meV
quantum well layer P1:
  material GaAlAS
  thickness = 8.5 nm
  $E_1 = 113$ meV
barrier layer B1:
  material $Ga_{0.75}Al_{0.25}AS$
  thickness = 11.3 nm
  $\Phi_1 = 218$ meV
quantum well layer $P_c$:
  material GaAS doped to $1.10^{18}$ cm$^{-3}$
  thickness = 20 nm
barrier layer B2:
  material $Ga_{0.75}Al_{0.25}AS$
  thickness = 11.3 nm
  $\Phi_2 = 218$ meV
quantum well layer P2:
  material GaAS
  thickness = 7.6 nm
  $E_2 = 128$ meV
barrier layer B4:
  material $Ga_{0.6}Al_{0.4}AS$
  $\Phi_4 = 328$ meV A structure such as this enables operation at wavelengths $\lambda_1 = 11$ μm and $\lambda_2 = 9.7$ μm.

It is clear that the above description has been given purely by way of a non-restrictive example and that other variants may be considered without going beyond the scope of the invention. This is especially so as regards the number of layers and quantum wells.

What is claimed is:

1. An electromagnetic wave modulator, comprising a semiconductor structure, comprising:
   a first alternation of semiconductor layers defining a first quantum well,
   a second alternation of layers joined to the first alternation of layers and defining a second quantum well coupled to the first quantum well through a barrier layer,
   means for populating the first quantum well with charged carriers, and
   a third alternation of layers located on the other side of the second alternation of layers from the first alternation and defining a third quantum well coupled to the first quantum well through another barrier layer,
   control means for controlling electromagnetic wave absorption by the semiconductor structure comprising means for providing an electrical field along either direction perpendicular to the plane of the layers,
   wherein the compositions of the wells are such that the second well has two energy levels, the difference $E_1$ of which corresponds to a wavelength $\lambda_1$ such that $hc/\lambda_1$ approximately equals $E_1$, where h is Planck's constant and c is the velocity of light in vacuum;
   wherein the compositions of the wells are such that the third well has two energy levels the difference $E_2$ of which corresponds to a wavelength $\lambda_2$ such that $hc/\lambda_2$ approximately equals $E_2$; and
   wherein $\lambda_1$ is not equal to $\lambda_2$.

2. A modulator according to claim 1, wherein the thickness and the composition of the layers are such that the second and third quantum wells each have a gap energy width different from that of the first well.

3. A modulator according to claim 2, wherein the gap energy widths of the second and third quantum wells are equal.

4. A modulator according to claim 2, wherein the means of populating the first quantum well with electrons comprise a doping of this well.

5. A modulator according to claim 2, wherein the means for populating with electrons couples to the semiconductor structure, a pump wave capable of populating the first quantum well with carriers during application of said electrical field so that carriers are transferred from said quantum well to the second or third quantum well.

6. A modulator according to claim 5, wherein the electron populating means are active upon command and are combined with control means to enable an AND function.

7. A modulator according to any of the above claims, wherein the pattern of the three quantum wells is repeated several times.

8. A modulator according to claim 1, wherein the means are ohmic contacts made on either side of the structure.

9. An electromagnetic wave detector applying the modulator according to any of the above claims, wherein the means for the application of an electrical field enable the structure to be polarized in a predetermined direction to detect either one wavelength $\lambda_1$ or another wavelength $\lambda_2$, and means for the detection of photocurrent created by the illumination at either one of the two wavelengths.

10. A modulator according to claim 1, wherein said first quantum well is undoped and said means for modulating comprises an optical beam source coupled to said first quantum well, said optical beam source coupling photons having energies above the bandgap of the first quantum well to said first quantum well to generate conduction electrons in said first quantum well.

11. A modulator according to claim 1 wherein said means for modulating comprises doping in the first quantum well.

12. A semiconductor electromagnetic wave modulator comprising:
first, second, and third quantum wells which are defined by a sequence of semiconductor layers wherein the second quantum well is between the first and third quantum wells and the first and second wells are of different thickness but are made from the same semiconductor material; and
control means for controlling electromagnetic wave absorption by one of the second and third quantum wells, comprising means for applying an electric field along either direction perpendicular to the plane of the layers;
wherein the first quantum well has two energy levels and the difference in energy between those two energy levels is $E_1$, $E_1$ approximately equals $hc/\lambda_1$, where h is Planck's constant and c is the velocity of light in vacuum;
wherein the third quantum well has two energy levels and the difference between those two energy levels is $E_2$, $E_2$ approximately equals $hc/\lambda_2$; and
wherein $\lambda_1$ is not equal to $\lambda_2$.

13. A device according to claim 12, wherein:
the second quantum well is thicker than either of the first and third quantum wells.

* * * * *